(12) United States Patent
Meiser et al.

(10) Patent No.: US 9,570,576 B2
(45) Date of Patent: Feb. 14, 2017

(54) METHOD FOR FORMING A SEMICONDUCTOR DEVICE HAVING INSULATING PARTS OR LAYERS FORMED VIA ANODIC OXIDATION

(71) Applicant: Infineon Technologies AG, Neubiberg (DE)

(72) Inventors: Andreas Meiser, Sauerlach (DE); Anton Mauder, Kolbermoor (DE); Markus Zundel, Egmating (DE); Hans-Joachim Schulze, Taufkirchen (DE); Franz Hirler, Isen (DE); Hans Weber, Bayerisch Gmain (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/102,290

(22) Filed: Dec. 10, 2013

(65) Prior Publication Data
US 2015/0162418 A1 Jun. 11, 2015

(51) Int. Cl.
*H01L 21/332* (2006.01)
*H01L 29/66* (2006.01)
(Continued)

(52) U.S. Cl.
CPC ..... *H01L 29/66333* (2013.01); *H01L 21/0223* (2013.01); *H01L 21/02118* (2013.01); *H01L 21/02238* (2013.01); *H01L 21/02258* (2013.01); *H01L 21/30604* (2013.01); *H01L 21/76898* (2013.01); *H01L 29/0634* (2013.01);
(Continued)

(58) Field of Classification Search
CPC .......... H01L 2224/32225; H01L 45/1266; H01L 45/16; H01L 21/76898; H01L 21/31687; H01L 21/02118; H01L 21/0223; H01L 21/02238; H01L 21/02258; H01L 21/30604; H01L 21/76831; H01L 29/0634; H01L 29/0661; H01L 29/402; H01L 29/66333; H01L 29/6634; H01L 29/66348
(Continued)

(56) References Cited

U.S. PATENT DOCUMENTS 4,131,488 A * 12/1978 Lesk et al. ............... 438/71
5,164,325 A 11/1992 Cogan et al.
(Continued)

FOREIGN PATENT DOCUMENTS

| DE | 10212144 A1 | 10/2003 |
|---|---|---|
| DE | 10212149 A1 | 10/2003 |
| DE | 10234996 A1 | 10/2003 |

OTHER PUBLICATIONS

P. Benkart, et al.; "3-Dimensional Integration Scheme with a Thermal Budget Below 300 Degrees C"; In: Book of Abstracts APCOT 2006, Asia-Pacific Conference of Transducers and Micro-Nano Technology, Marina Mandarin Hotel, Singapore, Jun. 25-28, 2006, p. 1-4.
(Continued)

*Primary Examiner* — Duy T Nguyen
(74) *Attorney, Agent, or Firm* — Eschweiler & Associates, LLC

(57) ABSTRACT

A method for forming a semiconductor device includes forming an electrical structure at a main surface of a semiconductor substrate and carrying out an anodic oxidation of a back side surface region of a back side surface of the semiconductor substrate to form an oxide layer at the back side surface of the semiconductor substrate.

6 Claims, 10 Drawing Sheets

(51) Int. Cl.
*H01L 21/02* (2006.01)
*H01L 21/306* (2006.01)
*H01L 29/06* (2006.01)
*H01L 21/768* (2006.01)
*H01L 29/739* (2006.01)
*H01L 29/78* (2006.01)
*H01L 29/40* (2006.01)
*H01L 29/861* (2006.01)

(52) U.S. Cl.
CPC .... *H01L 29/6634* (2013.01); *H01L 29/66712* (2013.01); *H01L 29/7396* (2013.01); *H01L 29/7811* (2013.01); H01L 21/76831 (2013.01); H01L 29/0661 (2013.01); H01L 29/402 (2013.01); H01L 29/66348 (2013.01); H01L 29/7397 (2013.01); H01L 29/861 (2013.01)

(58) Field of Classification Search
USPC .......................................... 438/138, 294, 459
See application file for complete search history.

(56) References Cited

U.S. PATENT DOCUMENTS

| | | | | |
|---|---|---|---|---|
| 6,084,284 | A * | 7/2000 | Adamic, Jr. | ................. 257/506 |
| 6,222,217 | B1 * | 4/2001 | Kunikiyo | ..................... 257/296 |
| 6,690,062 | B2 | 2/2004 | Henninger et al. | |
| 6,734,084 | B1 * | 5/2004 | Nemoto et al. | ............... 438/466 |
| 6,891,223 | B2 | 5/2005 | Krumrey et al. | |
| 2005/0245046 | A1 * | 11/2005 | Takafuji | .............. H01L 27/1203 438/450 |
| 2006/0042957 | A1 | 3/2006 | He | |
| 2006/0060238 | A1 * | 3/2006 | Hacke et al. | ................. 136/256 |
| 2006/0141751 | A1 | 6/2006 | Liao et al. | |
| 2008/0290366 | A1 * | 11/2008 | Lerner | ................ H01L 29/0696 257/133 |
| 2009/0250789 | A1 * | 10/2009 | Krutsick | ............ H01L 29/0821 257/565 |
| 2009/0316473 | A1 * | 12/2009 | Happ | ................. G11C 13/0004 365/163 |
| 2010/0032764 | A1 * | 2/2010 | Andry | ............... H01L 21/76898 257/369 |
| 2010/0140617 | A1 * | 6/2010 | Kuroda | ................... H01L 21/84 257/48 |
| 2010/0258177 | A1 * | 10/2010 | Ko et al. | ....................... 136/256 |
| 2012/0074570 | A1 * | 3/2012 | Kolb | ................ H01L 21/76898 257/751 |
| 2012/0204926 | A1 * | 8/2012 | Harley | ............. H01L 31/02244 136/244 |
| 2012/0305063 | A1 * | 12/2012 | Moslehi | ........... H01L 31/03528 136/256 |
| 2013/0105868 | A1 * | 5/2013 | Kalnitsky | .......... G01N 27/4145 257/288 |

OTHER PUBLICATIONS

Beynon, J, et al.: The Electrical Properties of Anodically Grown Silicon Dioxide Films. In: Solid-State 16 (1973), S. 309-314.

Mende, G, et al. The Electrophysical Properties of Anodically Grown Silicon Oxide Films. In: Thin Solid Films 168 (1989), S. 51-60.

Kaiser, Alexander. "Three-Dimensional System Integration: Technological Development and Use." Published by Cuvillier Verlag (2007), p. 55-57.

U.S. Appl. No. 14/102,107, filed Dec. 10, 2013. 32 Pages.

Non Final Office Action Dated Mar. 20, 2015 U.S. Appl. No. 14/102,107.

Notice of Allowance Dated Aug. 27, 2015 U.S. Appl. No. 14/102,107.

* cited by examiner

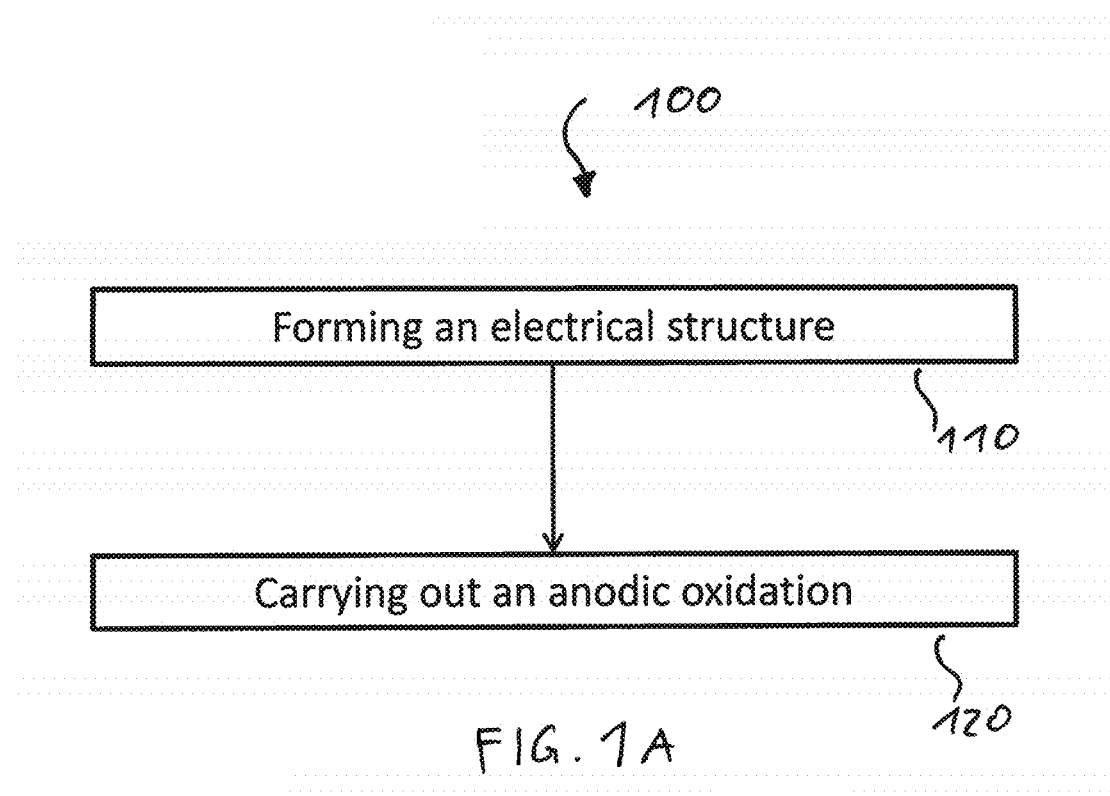

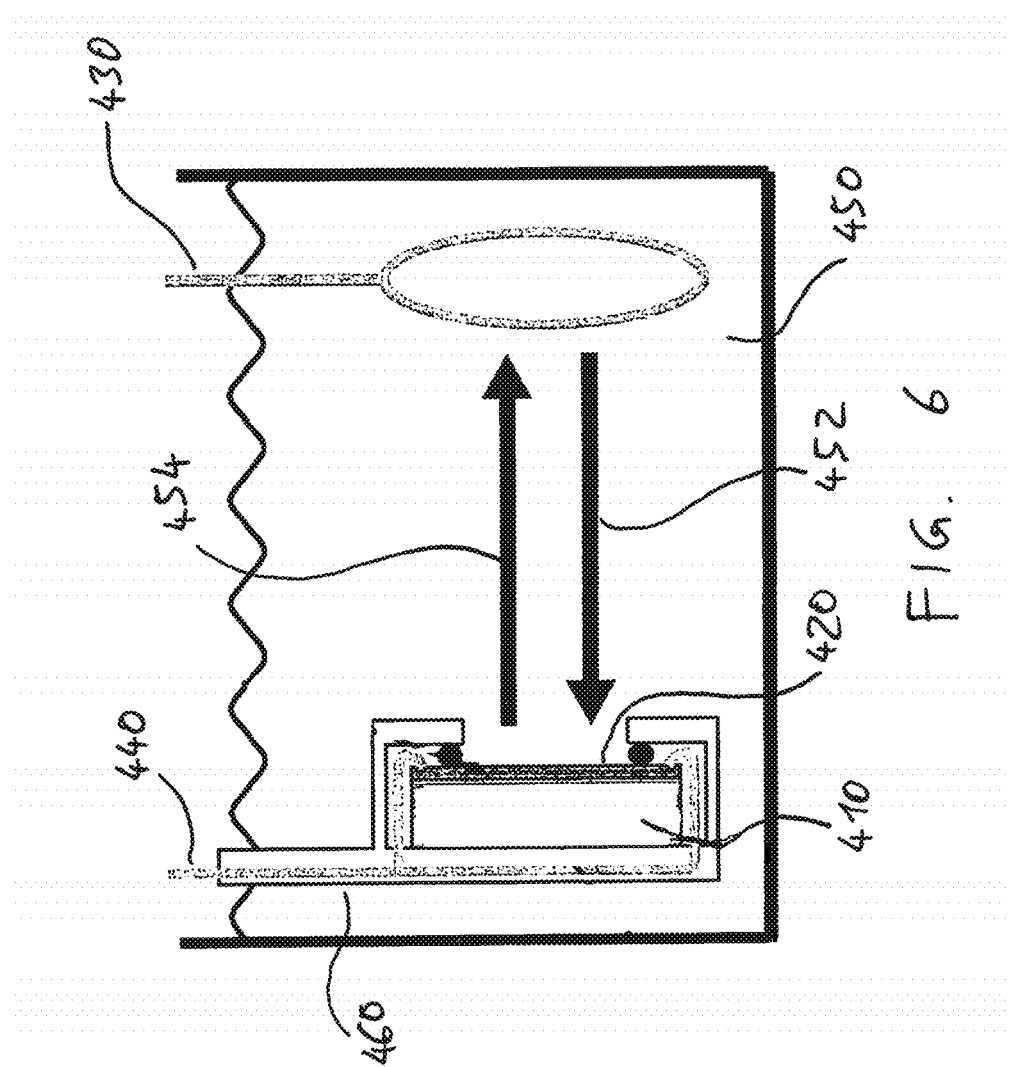

METHOD FOR FORMING A SEMICONDUCTOR DEVICE HAVING INSULATING PARTS OR LAYERS FORMED VIA ANODIC OXIDATION

FIELD

Embodiments relate to the manufacturing of semiconductor device and in particular to methods for forming a semiconductor device.

BACKGROUND

For the manufacturing of semiconductor devices, a large variety of materials and processes are used. Often, electrically conductive parts of the semiconductor device have to be electrically insulated from other electrically conductive parts of the semiconductor device. The maximal allowable voltages and the reachable lifetime of the semiconductor device are strongly influenced by the quality and the dimensioning of the electrically insulating parts of the semiconductor device. It is desired to increase the lifetime and/or the maximal allowable voltages of the semiconductor device.

SUMMARY

Some embodiments relate to a method for forming a semiconductor device. The method comprises forming an electrical structure at a main surface of a semiconductor substrate. Further, the method comprises carrying out an anodic oxidation of a back side surface region at the back side surface of the semiconductor substrate to form an oxide layer at the back side surface of the semiconductor substrate.

Further embodiments relate to a method for forming a semiconductor device comprising forming an electrically conductive layer above a main surface of a semiconductor substrate. Further, the method comprises carrying out an anodic oxidation of a surface of the electrically conductive layer to form an oxide layer at the surface of the electrically conductive layer. Additionally, the method comprises connecting a carrier substrate to the oxide layer and processing a back side of the semiconductor substrate.

Some embodiments relate to a method for forming a semiconductor device comprising forming an edge termination trench extending from a main surface of the semiconductor substrate towards an opposite back side of the semiconductor substrate. The trench surrounds an active area of the semiconductor substrate. Further, the method comprises carrying out an anodic oxidation of a surface of the edge termination trench to form an oxide layer at least at the wall of the edge termination trench.

BRIEF DESCRIPTION OF THE DRAWINGS

Some embodiments of apparatuses and/or methods will be described in the following by way of example only, and with reference to the accompanying figures, in which FIG. 1a shows a flow chart of a method for forming a semiconductor device;

FIG. 1b shows a schematic illustration of a semiconductor device;

FIG. 6 shows a schematic illustration of an anodic oxidation;

DETAILED DESCRIPTION

Figure 2A:
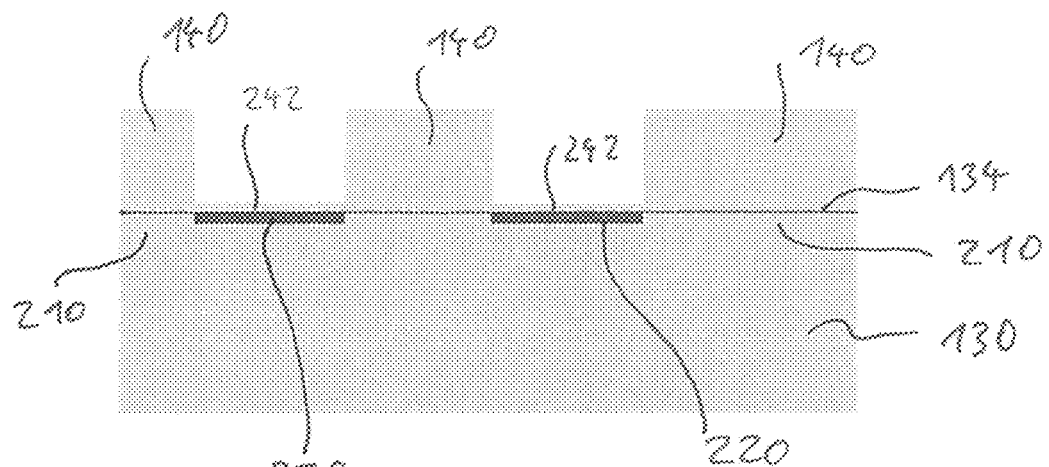
FIGS. 2a-2c show a schematic illustration of manufacturing a variable depth field stop layer.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Embodiments relate to the usage of anodic oxidation for forming insulating parts or layers of semiconductor devices. FIG. 6 shows a schematic illustration of a setup for anodic oxidation. A semiconductor substrate 410 is fixed on a holder 460 and placed within an electrolyte 450. Further, an external electrode 430 is placed within the electrolyte 450. By applying a voltage difference between the external electrode 430 (e.g. cathode) and an electrode 440 (e.g. anode) electrically connected to the semiconductor substrate 410, an electric field attracting oxidizing ions 452 to the semiconductor substrate can be generated. Ions of the opposite charge 454 are attracted by the external electrode 430. Due to the oxidizing ions, an oxide layer 420 is formed at a surface of the semiconductor substrate.

The kind or mixture of the electrolyte and/or the material of the external electrode may be selected depending on the kind of semiconductor substrate (e.g. Silicon, gallium nitride, Silicon Carbide), for example. In an example, the semiconductor substrate is a Silicon-based semiconductor substrate and an alkaline dissolution may be used.

The alkaline dissolution (e.g. Potassium hydroxide KOH, Tetramethylammonium hydroxide TMAH, Potassium nitrate $KNO_3$) may dissociate in positive and negative charged molecule parts. For example, the following reaction equation may apply for $KNO_3$:

$$KNO_3 + H_2O \rightarrow K^+ + OH^- + HNO_3$$

$OH^-$ ions getting in contact with Silicon can be used for forming an oxide layer. For this, a sufficient supply of $OH^-$ to the Silicon through the already established oxide layer by diffusion may be desired to be kept high. This diffusion may be accelerated by an electrical field (attracting electrical field) during the anodic oxidation so that significantly larger oxide thicknesses may be reached then with a native oxide.

For example, for a Silicon semiconductor substrate, the oxidizing ions may be OH-ions and the electrode connected to the semiconductor substrate may be used as an anode and the external electrode may be used as a cathode (e.g. platinum cathode).

In this way, an oxidation of n-doped and/or p-doped Silicon may be enabled.

FIG. 1 shows a schematic illustration of the flow chart of a method 100 for forming a semiconductor device according to an embodiment. Further, FIG. 1*b* shows a schematic illustration of a semiconductor device 190 manufacturable by the method 100 shown in FIG. 1*a*. The method 100 comprises forming 110 an electrical structure 150 at a main surface 132 of a semiconductor substrate 130. Further, the method 100 comprises carrying out an anodic oxidation 120 of a back side surface region at a back side surface 134 of the semiconductor substrate 130 to form an oxide layer 140 at the back side surface 134 of the semiconductor substrate 130.

By using an anodic oxidation, an oxide layer 140 can be manufactured at the back side of a semiconductor substrate 130 although an electrical structure 150, which may bear only low temperatures, is already formed at the main surface 132 of the semiconductor substrate 130, for example.

The electrical structure 150 may be any element of an electrical circuitry (e.g. a doping region, an insulation structure, gate or a metallization of a diode, a transistor, a resistor, a capacitor or an inductor or a more complex structure as a diode, a transistor, a resistor, a capacitor or an inductor structure) required by the semiconductor device 190 to be formed. One or more elements of the electrical structure 150 (e.g. metallization or doping profile of doping regions) may be sensitive to high temperatures and may change properties in an undesired way, if the maximal allowable bearable temperature is exceeded during later processes, for example.

The main side of the semiconductor substrate 130 may be the surface used to implement more sophisticated and complex structures than at the back side, since the process parameters (e.g. temperature) and the handling is limited for the back side, if structures are already formed at one side of the semiconductor substrate, for example.

A main surface of the semiconductor substrate 130 may be a surface of the semiconductor substrate 130 towards metal layers, insulation layers or passivation layers on top of the semiconductor substrate 130. In comparison to a basically vertical edge (e.g. resulting from separating the semiconductor dies from others) of the semiconductor substrate 130, the main surface of the semiconductor substrate 130 may be a basically horizontal surface. The main surface of the semiconductor substrate 130 may be a basically even plane (e.g. neglecting unevenness of the semiconductor structure due to the manufacturing process or trenches). In other words, the main surface of the semiconductor structure may be the interface between the semiconductor material and an insulation layer, metal layer or passivation layer on top of the semiconductor substrate 130.

The semiconductor substrate of the semiconductor device may be a silicon-based semiconductor substrate, a silicon carbide-based semiconductor substrate, a gallium arsenide-based semiconductor substrate or a gallium nitride-based semiconductor substrate, for example.

The anodic oxidation can be done at very low temperatures (e.g. also close to room temperature). For example, the anodic oxidation may be done at a process temperature lower than a maximum temperature (e.g. below 650° C., below 450° C., below 250° C. or below 150° C.) bearable by the electrical structure 150 at the main surface 132.

The anodic oxidation can be done at very low temperatures (e.g. also close to room temperature). For example, the anodic oxidation may be done at a process temperature lower than a maximum temperature (e.g. below 650° C., below 450° C., below 250° C. or below 150° C.) bearable by the electrical structure 130 at the main surface 132.

Further, optionally also (e.g. all) processes carried out after the anodic oxidation may comprise or use process temperatures below the maximum temperature bearable by the electrical structure 150 (e.g. below 650° C., below 450° C., below 250° C. or below 150° C.).

A back side anodic oxidation layer may be used for a large variety of semiconductor devices.

For example, some semiconductor devices may comprise regions of different conductivity types (n-doped or p-doped) at the back side of the semiconductor device. It may be desired to contact only one or some of the different doping regions by an electrical contact. For this, the oxide layer may only be grown at doping regions of one conductivity type or the growth of the oxide layer may be masked.

A doping region of the first conductivity type may comprise a p-doping (e.g. caused by incorporating aluminum ions or boron ions) or an n-doping (e.g. caused by incorporating nitrogen ions, phosphor ions or arsenic ions). Consequently, the second conductivity type indicates an opposite n-doping or p-doping. In other words, the first conductivity type may indicate an n-doping and the second conductivity type may indicate a p-doping or vice-versa.

Further, the method 100 may optionally comprise forming an electrically conductive layer at the back side of the semiconductor substrate 130. At least a part of the electrically conductive layer may be separated from the back side surface 134 of the semiconductor substrate by the oxide layer 140.

In an example, the oxide layer 140 may remain at least within an edge termination region surrounding the semiconductor substrate 130. The edge termination region may be a region extending from an edge of the semiconductor substrate laterally towards an active region of the semiconductor substrate 130 (e.g. emitter region of an insulated gate bipolar transistor IGBT or a drain region of a metal oxide semiconductor transistor MOSFET). In this way, the risk of leakage currents within the edge region may be significantly reduced or avoided.

Optionally, alternatively or additionally to one or more aspects mentioned above, n-doped regions and p-doped regions may be arranged adjacent to each other at the back side surface of the semiconductor substrate 130. In this case, the oxide layer 140 may be grown significantly thicker at the n-doped regions than on the p-doped regions. In other words, the method 100 may further comprise forming at least one p-doped region adjacent to at least one n-doped region at the back side surface 134 of the semiconductor substrate 130. The oxide layer 140 in a first portion of the back side surface extending along the n-doped region may comprise a greater thickness than the oxide layer 140 in a second portion of the back side surface extending along the p-doped region (e.g. 2×, 5×, 10× or more than 20× the thickness in the second portion). In this way, a masked or a stepped implant may be enabled, for example.

During the anodic oxidation a thin oxide layer or no oxide layer may be grown at the p-doped region. The thin oxide layer may be removed afterwards. In other words, the method 100 may further comprise removing the oxide layer within the second portion, for example. In this way, an electrical contact to the p-doped region by an electrical conductive layer deposited at the back side of the semiconductor substrate 130 may be enabled.

Optionally, alternatively or additionally to one or more aspects mentioned above, an ion implant may be applied to the first portion with the thick oxide layer and the second portion with the thin oxide layer. The ions may not reach the semiconductor substrate 130 in the first portion due to the thick oxide, while the ions may reach the semiconductor substrate 130 within the second portion through the thin oxide. In this way, a stepped field stop region or field stop layer may be formed, for example. In other words, the method 100 may comprise implanting ions at the first portion and the second portion to form a field stop region at least at the second portion. Alternatively, the implant energy may be sufficiently high to implant further thick oxide within the first portion so that a stepped field stop layer may be obtained.

The anodic oxidation may provide a possibility for forming an oxide layer at very low temperatures. In this way, temperature-sensitive elements already manufactured on the semiconductor substrate may be protected from high temperatures. Optionally, additionally or alternatively to one or more aspects mentioned above, processes for forming the semiconductor substrate carried out after the anodic oxidation may comprise mainly (e.g. neglecting short temperature peaks) or only process temperatures below 650° C. (or below 450° C., below 250° C. or below 150° C.). In this way, an oxide layer may be manufacturable although one or more already formed elements of the semiconductor device cannot bear temperatures above 650° C. (or above 450° C., above 250° C. or above 150° C.), for example. For example, an oxide layer may be manufacturable at a backside of a semiconductor substrate although a temperature element sensitive to high temperatures (e.g. metal layer on top of the semiconductor substrate) may be already formed at the main surface of the semiconductor substrate.

Optionally, additionally or alternatively to one or more aspects mentioned above, the method for manufacturing a semiconductor device may comprise forming at least one field effect transistor structure (e.g. Metal-Oxide-Semiconductor-Field-Effect-Transistor MOSFET or an Insulated Gate Bipolar Transistor IGBT) on the semiconductor substrate. The field effect transistor structure may use a part of the anodic oxide layer as gate oxide, as insulation layer for insulating an electrical conductive layer connecting one part from another part or as trench isolation, for example.

Optionally, alternatively or additionally to one or more aspects mentioned above, at least one element of the semiconductor device (e.g. a field effect transistor structure, an Insulated Gate Bipolar Transistor structure or a diode structure) may comprise a blocking voltage or breakdown voltage of more than 10 Volts (or more than 100 Volts, more than 400 Volts, more than 600 Volts or more than 1200 Volts). In other words, the semiconductor device may comprise a blocking voltage or breakdown voltage of more than 10 Volts. For example, the semiconductor device may be a power semiconductor device.

In some embodiments, the oxidation may be accelerated by illuminating the surface to be oxidized by a light source (e.g. halogen lamp). Electron-hole-pairs may be generated by the light, which may be separated from each other due to the electric field. The holes may accumulate below the generated anodic oxide and may lead to a drop of the whole applied voltage over this oxide. Consequently, the field strength within this oxide may be very high so that a diffusion of OH$^-$-ions may be accelerated.

Figure 2B:
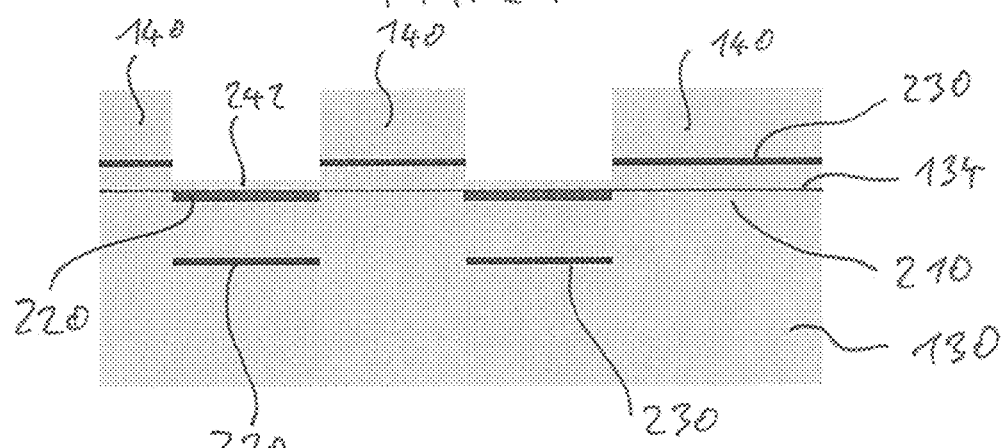
Figure 2C:
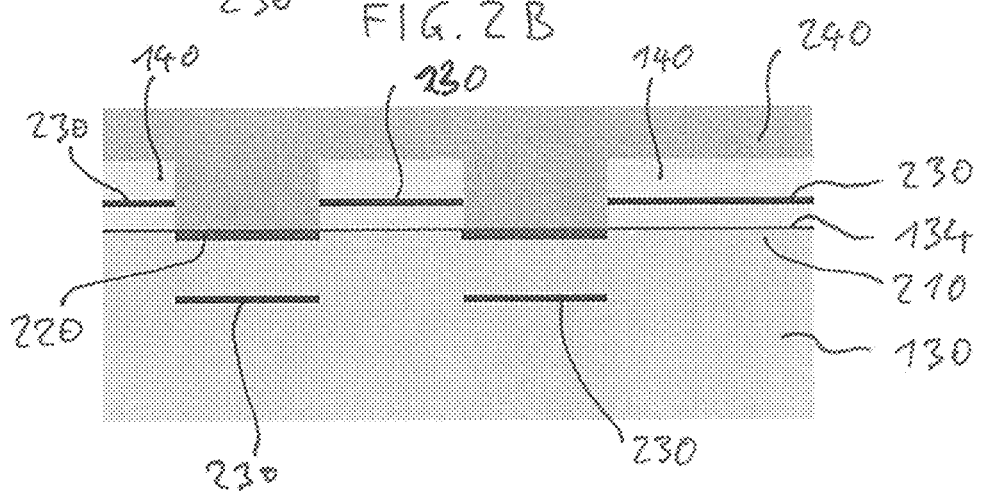

FIGS. 2a-2c show a schematic illustration of the forming of a stepped field stop zone by schematic cross sections of a part of a semiconductor device during manufacturing. In this example, the back side of the semiconductor device is shown on top (the at least one electrical structure at the main surface is not shown). After the anodic oxidation, an oxide layer 140 is deposited with significantly larger thickness at n-doped surface regions 210. A thin portion 242 of the oxide layer 140 is also formed on top of the p-doped surface regions 220. Then, ions 230 are implanted reaching the semiconductor substrate 130 only within the p-doped regions 220 as shown in FIG. 2b. The thin oxide 242 may be removed prior or after the ion implantation at least in the contact areas. Afterwards, a back side metal layer 240 is deposited at the back side of the semiconductor substrate 130 to form an electrical connection to the p-doped surface regions 220 as shown in FIG. 2c.

Optionally, the method may comprise implanting dopants at the first portion and the second portion to form a field stop region at least at the second portion.

In other words, the structures shown in FIGS. 2a-2c are arranged at a wafer back side, while MOS (Metal Oxide Semiconductor) cells with planar or trench gate may be located at the wafer front side, for example. n and p may be adjacent to each other and an anodic oxidation of only n or n significantly thicker than p may be done (e.g. resulting in anodic cold grown oxide). Optionally, p may be removed (and the oxide on the p-regions). Further, the implantation of, for example, n may be masked by the thick oxide. n may enter the semiconductor only at the windows (area without oxide) resulting in a field stop stepped in the penetration depth. The implantation may be done at temperatures, which may be compatible with the metallization (e.g. also with microwave-supported annealing process). The lines 230 shown in FIGS. 2b and 2c may indicate an end of range of the implantation, for example. The field stop zone can be created for example by a proton irradiation from the wafer backside with a subsequent annealing step at temperatures between 320° C. and 440° C. Optionally, a short or also a long overetch at the back side followed by forming of a metallization at the back side (e.g. by a back side metal) may be done.

Optionally, alternatively or additionally to one or more aspects mentioned above, the oxide layer may be locally removed to enable an implant of desired doping regions or to enable an electrical contact to the backside metallization. For example, the method may comprise removing the oxide layer 140 at the back side emitter region (e.g. region located at the back side surface of the semiconductor substrate to be used for forming an emitter region) and forming an emitter doping region (e.g. p-doped or n-doped emitter) within the semiconductor substrate 130 at the back side emitter region arranged at the back side surface 134 of the semiconductor substrate 130.

For example, the emitter doping region comprises a first conductivity type and an adjacent part of the semiconductor substrate comprises a second conductivity type. (FIG. 3a)

Figure 3A:
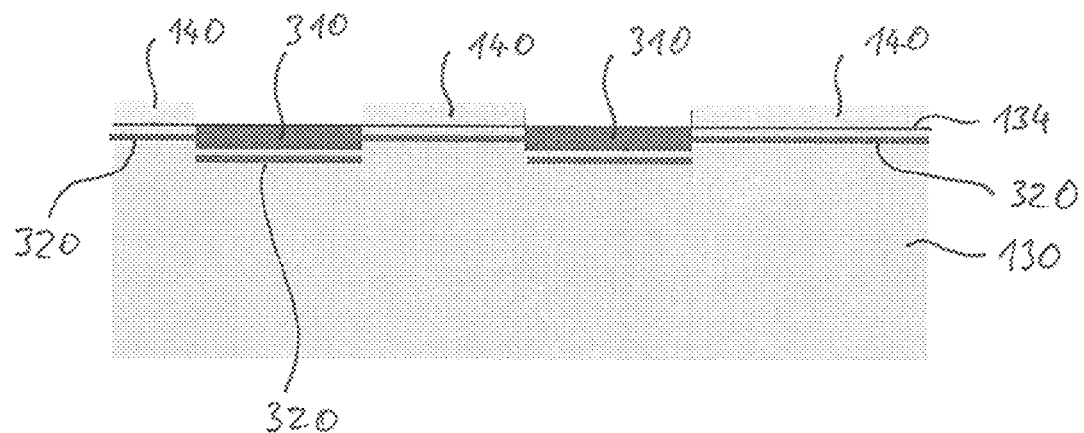
FIGS. 3a and 3b show a schematic illustration of semiconductor devices with variable depth doping layers.

FIG. 3a shows a schematic cross section of a semiconductor device with a locally removed oxide layer 140. Emitter doping regions with p-doping are implemented at the back side emitter regions 310 with removed oxide by a low energy implant. Further, optionally a further p-implant or n-implant may be done with higher energies so that the end of range of the implantation 320 is located within the semiconductor substrate also in regions with the still existing oxide layer 140. The semiconductor substrate may be an n-doped semiconductor substrate. The back side emitter structure shown in FIG. 3a may be a back side emitter of an insulated gate bipolar transistor, for example.

In other words, the method may optionally comprise implanting ions of the first conductivity type with an implant energy higher than an implant energy used for forming the emitter doping region to generate the first conductivity type doping layer within a region covered by the oxide layer and within the back side emitter region. The first conductivity type doping layer may reach to a first average depth within the back side emitter region and to a second average depth within the region covered by the oxide layer. The first depth may be larger than the second depth. The implantation dose for these two or even more implantation steps may be the same or may be different.

For example, a locally integrated back side emitter may be formed by an anodic oxidation, opening of windows within the oxide and implantation of a p-back side emitter of an IGBT with low energy, for example. Optionally, a further implantation of p with higher energy and lower dose (entering all over) may be done. Further, a back side metal may be formed (not shown in FIG. 3a).

Figure 3B:
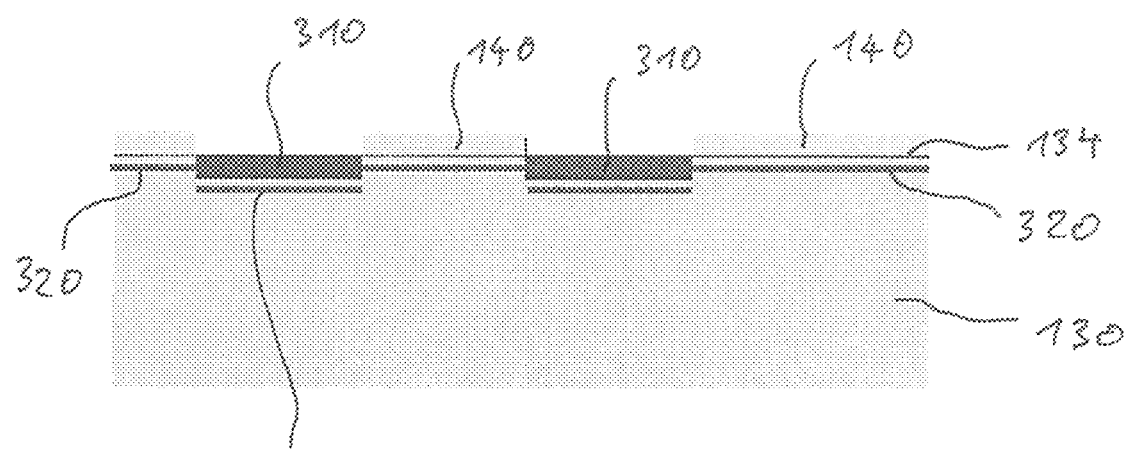

FIG. 3b shows a schematic cross section of another semiconductor device. The semiconductor device shown in FIG. 3b is implemented similar to the semiconductor device shown in FIG. 3a. However, the semiconductor device of FIG. 3b comprises back side emitter regions with n-doping and the optional further implant with higher energies may be also an n-implant while the semiconductor substrate 130 comprises also an n-doping. Such a back side emitter structure may be used for a diode or a MOSFET, for example.

In other words, the locally integrated back side emitter structure shown in FIG. 3b may be formed by an anodic oxidation, an opening of windows in the oxide and an implantation of an n-back side emitter of a diode with low energy, for example. Optionally, an implantation of n with higher energies and lower dose (entering all over) may be done. Further, a back side metal (not shown) may be formed.

The oxide layer 140 may be an anodic cold grown oxide with implantation windows, for example.

This may be an example for a (back side emitter structure) fast diode. The fast diode may be a diode, which stores few charge carriers in the volume during the flow operation or on state and may be fast cleared with low reverse current, for example. For a further reduction of the amount of stored charge carriers, the vertical dimension of the diode may be kept low so that the device can just hold the blocking requirements. In this case, the electrical field reaches far into the device and to the back side emitter. If the back side emitter has a small defect (e.g. due to an implantation may be masked by a particle), the leakage current may rise on this side. The anodic grown oxide may avoid a leakage current due to the dielectric insulation. This may occur more at low-doped field stops (e.g. implanted doses of 1e12 to 1e13/cm$^2$) than at highly doped emitters (e.g. implanted dose of 1e14 to 1e15/cm$^2$).

Optionally, alternatively or additionally to one or more aspects mentioned above, a through silicon via may be used for connecting an element of the electrical structure (e.g. source, drain and/or gate of a field effect transistor structure) at the main side of the semiconductor substrate 130 from the back side of the semiconductor substrate 130. The through silicon via may require an insulation towards the surrounding semiconductor material. This insulation may be implemented by an anodic oxide layer as mentioned above.

In other words, the method 100 may further comprise forming a trench extending from the back side surface 134 of the semiconductor substrate 130 to a part of the electrical structure 150 at the main side of the semiconductor substrate 130. Further, the oxide layer 140 formed during the anodic oxidation may cover at least a wall (or all walls or all surfaces towards a semiconductor material) of the trench. In this way, leakage currents at the through silicon via may be kept low due to the good quality and/or thickness of the oxide layer 140.

Figure 4:
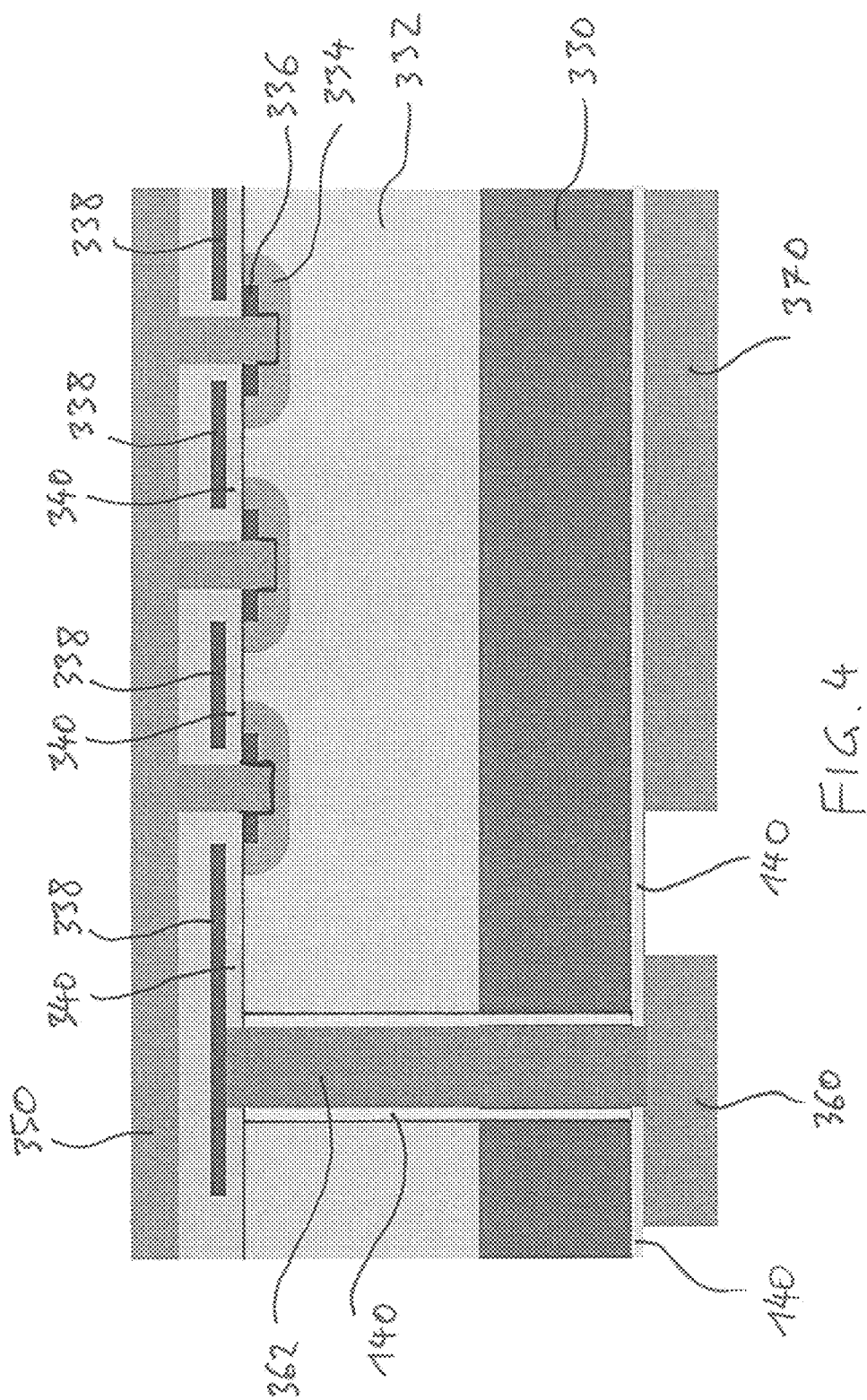
FIG. 4 shows a schematic cross section of a semiconductor device with a through silicon via.

FIG. 4 shows a schematic cross section of a semiconductor device according to an embodiment. The semiconductor device shown in FIG. 4 is implemented similarly to the semiconductor device shown in FIG. 1b, for example. A plurality of electrical structures represented by planar MOSFET-structures are arranged at the main side of the semiconductor substrate. Each MOSFET-structure comprises a gate 338 at least one source region 336 and a body region 334. The gate 338 is insulated from the source region 336 and the body region 334 by a gate oxide 340. The source regions 336 and the body regions 334 are electrically connected by a source metal layer 350 at the main surface of the semiconductor substrate. Further, the semiconductor device comprises a common drift zone 332 (e.g. n-doped) and a substrate 330 reaching to the back side of the semiconductor device. At least one gate 338 is electrically connected to a back side gate metal 360 through a through silicon via 362. Further, a structured drain metal layer 370 is arranged at the back side of the semiconductor device electrically connecting the substrate 330 (not shown in FIG. 4). The through silicon via 362 is implemented by a trench through the semiconductor substrate extending from the back side of the semiconductor substrate to at least one gate 338 at the main side of the semiconductor substrate. The walls of the trench as well as at least a part of the back side surface of the semiconductor substrate are covered by an anodic oxide layer 140. Further, the remaining trench is filled with an electrically conductive material (e.g. poly silicon) so that the back side gate metal 360 is electrically connected to the at least one gate 338.

In other words, a MOSFET with a cell structure at the wafer front side may be formed and the gate electrode is contacted through to the wafer back side by a vertically contacting structure (e.g. through silicon via TSV) laterally insulated towards the semiconductor. Further, an insulation by anodic oxide is manufactured at the wafer back side. Optionally, the oxide may be located also at the side walls of the TSV. Afterwards, the TSV is filled by a conductor (e.g. poly-silicon, metal as copper, aluminum, silicide or carbon). Then, a structured metal layer is formed at the wafer back side for a later connection of drain and gate with electrodes of a package. A chip may be attached with the front side (=source electrode) to a package lead-frame resulting in a source-down configuration.

Due to the source-down configuration, a reduction of the heating can be achieved at the location, the heat is generated (in the region of the channel), resulting in better thermal properties, for example. Further, the lead-frame may be in connection with the heat drain (e.g. ripped cooling element or copper surface of a circuit board). If the lead-frame is connected to the drain potential, a change of the drain potential of at least the height of the applied voltage may occur at each switching. The lead frame may comprise a dielectric insulation to the heat drain and a low capacity coupling, but may comprise a good thermal coupling. The capacitive coupling may lead to a reduced Electromagnetic Compatibility (EMC). With the constant source potential, the EMC may be kept high. Furthermore, an easy chip-by-chip assembly within the same package may be possible, since several chips with source potential at the back side may be mounted to the same lead frame (e.g. no insulation of chips may be necessary), for example.

Optionally, alternatively or additionally to one or more aspects mentioned above, complex electrical structures may also be formable at the back side of the semiconductor substrate 130 due to the anodic oxidation, since insulation layers may be available at low process temperatures. For example, the method 100 may further comprise forming a field effect transistor structure (e.g. at least a gate, a source region and a body region) at the back side of the semiconductor substrate 130. The oxide layer 140 may form a gate oxide of the field effect transistor structure at the back side.

Figure 5A:
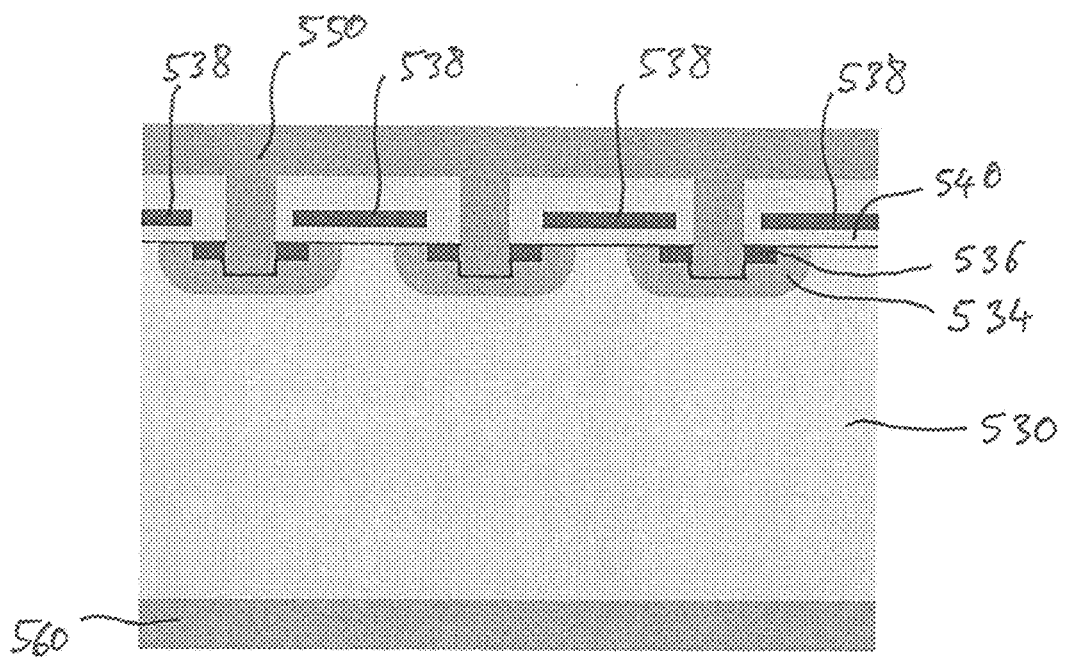
FIGS. 5a and 5b show schematic illustrations of forming a semiconductor device with field effect transistor structures at the back side of the semiconductor device.
Figure 5B:
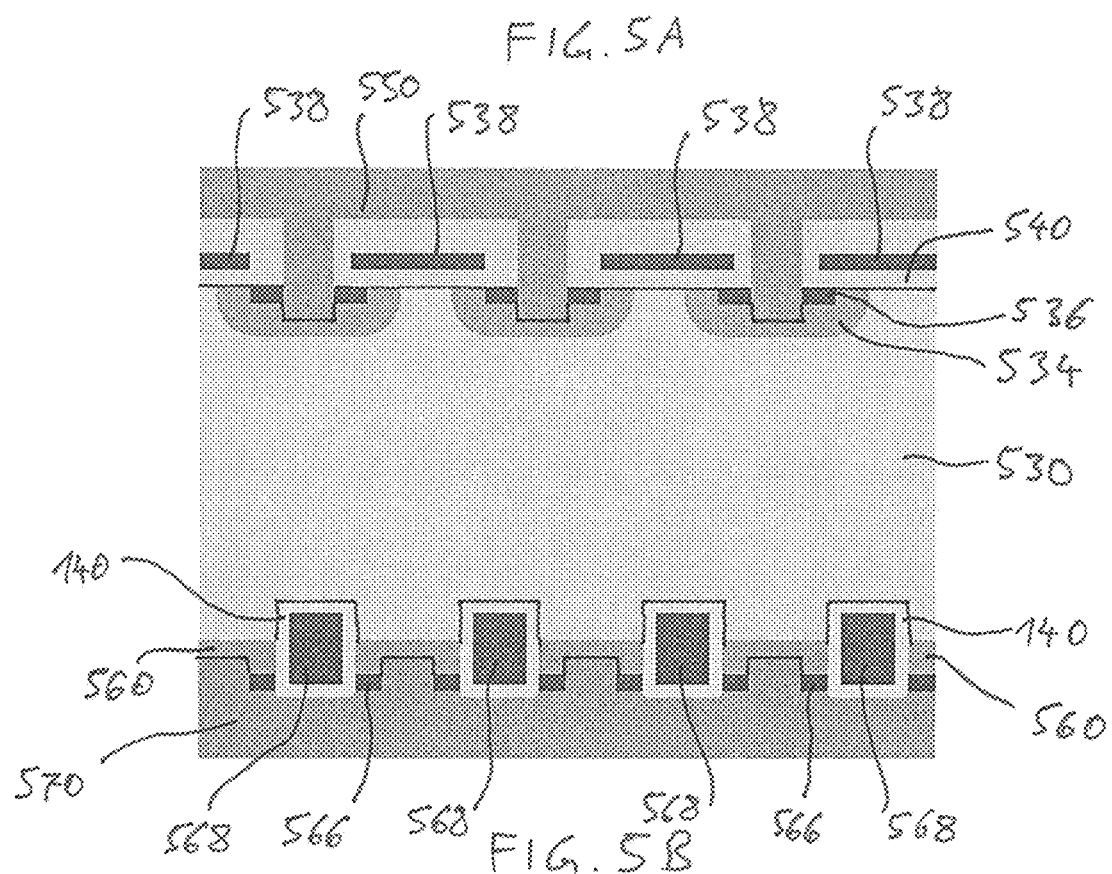

FIGS. 5a and 5b show a schematic illustration of the forming of a semiconductor device according to an embodiment. The semiconductor device shown in FIGS. 5a and 5b may be implemented similar to the semiconductor device shown in FIG. 1b or 4, for example. Planar MOSFET-structures, each comprising at least a gate 538, a source region 536 and a body region 534 are formed at the main surface of the semiconductor substrate. The gates 538 are insulated from the source regions 536 and the body regions 534 by gate oxide 540. The source regions 536 and the body regions 534 are electrically connected to each other by a source metal layer 550 at the front side. Further, a common n-doped drift zone 530 is formed within the semiconductor substrate. Then, a body layer 560 is implemented at the back side. Further, MOSFET-structures, each comprising at least a back side gate 568, a back side source region 566 and a back side body region 560 are formed. The gates 568 are arranged within trenches reaching through the body layer 560. The gates 568 (e.g. implemented by a gate poly) are insulated from the semiconductor material by an anodic oxide layer 140 representing also the gate oxide of the MOSFET-structures. Further, the source regions 566 and the back side body regions 560 are electrically connected to each other by a back side source metal layer 570.

In other words, first an MOSFET with the cell structure at the wafer front side is formed. In FIGS. 5a and 5b planar cells are shown, but also trench gate cells similar to the cells at the back side may also be possible. Then, the wafer is thinned to a target thickness (e.g. optionally with carrier at the front side). Then, trenches are etched through the back side body and an anodic oxidation of the trenches as a gate side oxide at the back side is done. Further, the back side trenches are filled with poly-silicon (e.g. and optional recess). Then, the back side poly-trenches are covered with a dielectric. Then, a contact hole etching through the dielectric is done in order to enable a connection to the back side metallization. The gate electrodes or gate metal is not shown in FIGS. 5a and 5b. The gate electrodes may comprise separate pads at the front side and at the back side or one of the gates may be brought to the other wafer side through a through silicon via and may be connected there.

Optionally, additionally or alternatively to one or more aspects mentioned above, the method 100 may further comprise forming trenches into the semiconductor substrate. The trenches comprise a depth and/or aspect ratio so that the trenches are at least partly filled or closed due to the following anodic oxidation. In other words, the trenches may be at least mainly filled by the oxide layer 140 itself after the anodic oxidation. The trenches may comprise the same depth or may comprise a varying depth. By varying the depth of the trenches, the thickness of the oxide layer may be laterally varied, for example.

Optionally, the thickness of the cold oxide or anodic oxide may be increased in various ways (e.g. stimulating by illuminating with light). For example, a thickening of the cold formed oxide (oxide formed by anodic oxidation) may be done by generating trenches, which are dimensioned so that the trench as well as the mesa (semiconductor material laterally between trenches) is oxidized (trench may be closed due to the oxidation). A targeted tilt of the oxides may be formed by different widths or depths of the trenches, for example. The depth of the trenches may define or influence the thickness of the resulting cold oxides.

Optionally, additionally or alternatively to one or more aspects above, the electrical structure 150 at the main surface of the semiconductor device may be a field effect transistor structure (e.g. MOSFET-structure or IGBT-structure), a diode structure, a resistor structure, an inductor structure or a capacitor structure, for example.

Figure 7:
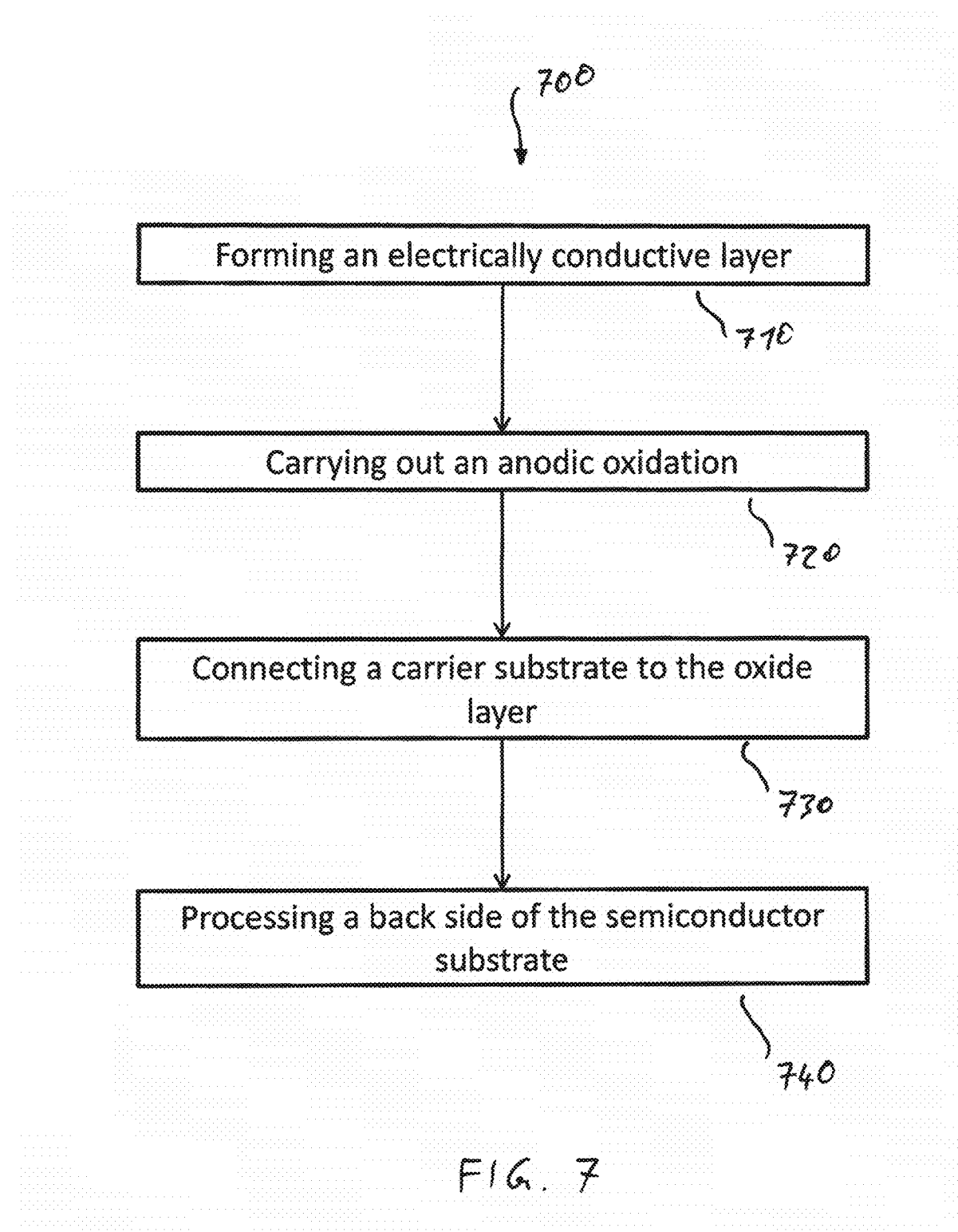
FIG. 7 shows a flow chart of a method for forming a semiconductor device.
Figure 8A:
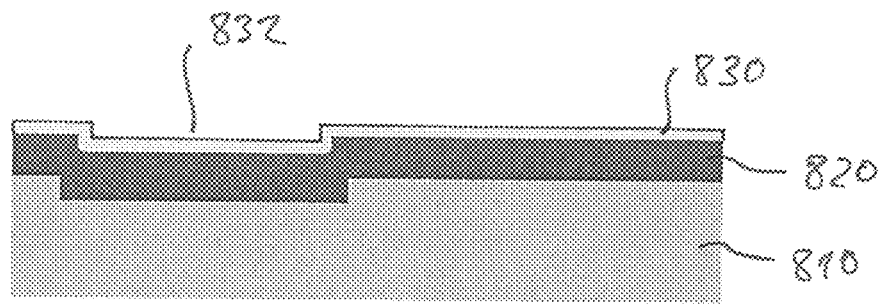
FIGS. 8a and 8b show a schematic illustration of the forming of a semiconductor device by using a carrier substrate.
Figure 8B:
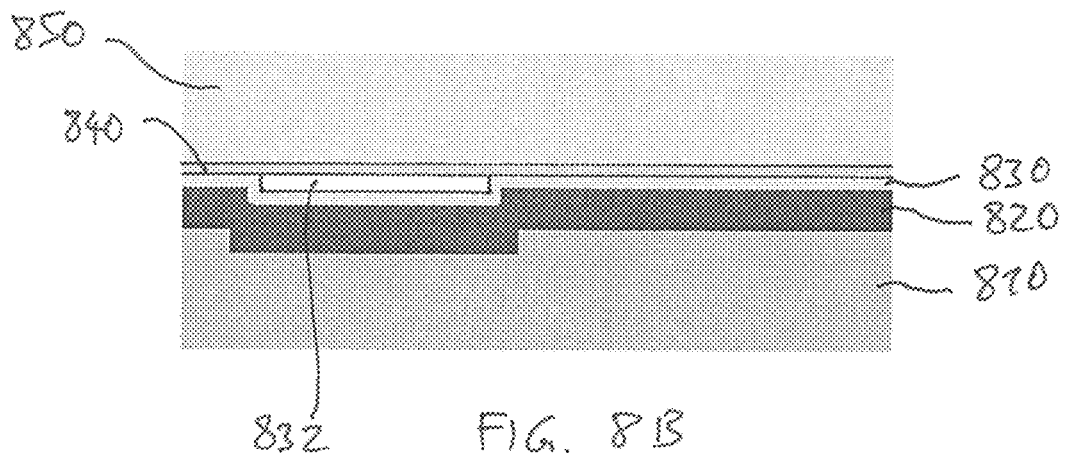

FIG. 7 shows a flow chart of a method 700 for forming a semiconductor device and FIGS. 8a and 8b show such a semiconductor device according to an embodiment. The method 700 comprises forming 710 an electrically conductive layer 820 (e.g. n-doped poly-silicon) above a main surface of a semiconductor substrate 810 and carrying out an anodic oxidation 720 of a surface of the electrically conductive layer 820 to form an oxide layer 830 at the surface of the electrically conductive layer 820. Further, the method 700 comprises connecting 730 a carrier substrate 850 to the oxide layer 830 and processing 740 a back side of the semiconductor substrate 810.

By using an anodic oxidation, an arbitrary surface may be a starting point for forming an oxide layer, since an electrically conductive material may be deposited on an arbitrary surface and may be oxidized afterwards. Further, such an oxide layer may be used for attaching a carrier substrate 850 to a semiconductor device for handling the semiconductor device for back side processing, for example. The electrically conductive layer may be any material which can be oxidized by an anodic oxidation (e.g. poly-silicon). The electrically conductive layer 820 may be a layer in direct contact with the semiconductor substrate or may be arranged on top of one or more additional insulating layers and/or electrically conductive layers stacked on top of the semiconductor substrate, for example. In both cases, the electrically conductive layer is arranged above the semiconductor substrate.

Details regarding a main surface and a semiconductor substrate are explained in connection with FIG. 1*b*.

The anodic oxidation may be carried out as described in connection with FIG. 6.

The carrier substrate may comprise any material connectable to the oxide layer of the semiconductor device. The carrier substrate 850 itself may comprise an optional oxide layer 840 at the surface to be connected to the oxide layer 830 of the semiconductor device.

Optionally, the surface of the oxide layer 830 may comprise at least one uneven area 832 causing a gap between the carrier substrate 850 and the oxide layer 830. Then, the method 700 may further comprise removing the carrier wafer 850 (after processing of the back side) by inserting acid (e.g. HF) at least into the gap, for example.

For example a high-temperature carrier may be provided by depositing polysilicon, performing an anodic oxidation and bonding a (oxidized) carrier wafer to the anodic oxide. Usually low-temperature carriers may bear only temperatures up to 100° C. while metallization and passivation of a wafer may bear temperatures up to 450° C., for example. Therefore, a carrier system manufacturable at lower temperatures than 400-450° C. may be desired, which may be possible by an anodic oxidation in combination with an anodic bonding.

If capillary tubes are present (unevenesses of the oxide layer), the carrier may be separated more easily and/or faster (e.g. in an HF-dissolution). The poly-silicon may be removed by etching afterwards.

The poly-layer may be a barrier against alkaline ions so that anodic bonding may be usable as bond method. Without the poly-barrier layer, a high contamination of natrium ions may occur, since oxide may be no diffusion barrier against natrium and the natrium contamination may reach the active chip region, for example.

The method 700 may comprise one or more further optional additional acts corresponding to one or more aspects mentioned in connection with described concepts or one or more embodiments described above (e.g. FIGS. 1-6). Further, the aspects of the method shown in FIG. 7 may be applied also to embodiments described above.

Figure 9:
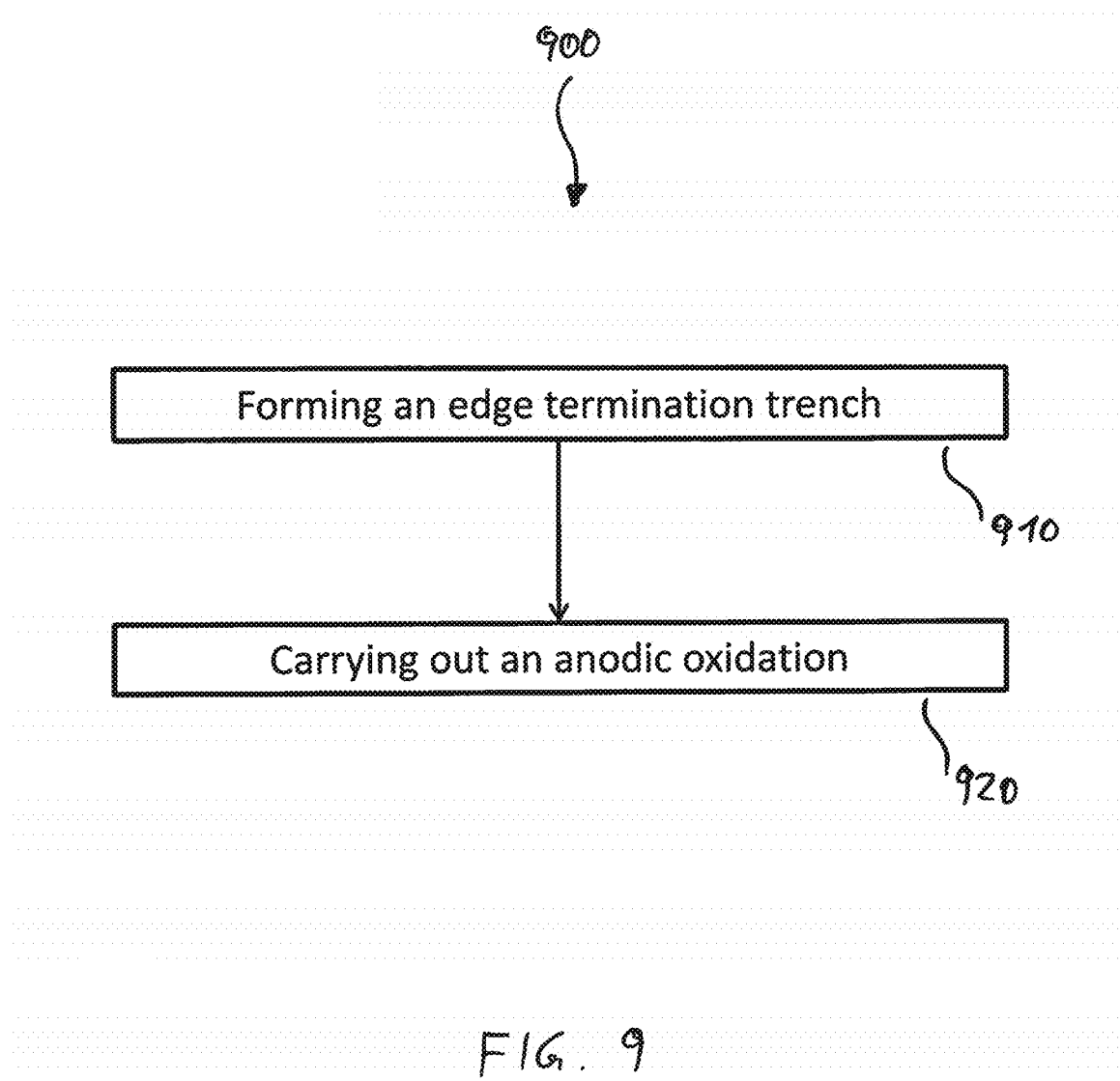
FIG. 9 shows a flow chart of a method for forming a semiconductor device.

FIG. 9 shows a flow chart of a method 900 for forming a semiconductor device according to an embodiment. The method 900 comprises forming 910 an edge termination trench extending from a main surface of a semiconductor substrate towards an opposite back side of the semiconductor substrate. The trench surrounds an active area of the semiconductor substrate. Further, the method comprises carrying out an anodic oxidation 920 of a surface of the edge termination trench to form an oxide layer at least at a wall of the edge termination trench.

By implementing trenches at the edge of a semiconductor device, difficulties with high electric fields and/or large voltage differences occurring at the surface of the semiconductor substrate at the edges of the semiconductor substrate can be reduced or avoided. Due to the low process temperatures necessary for the anodic oxidation, the edge termination trenches can be formed and electrically insulated after one or more electrical structures are already implemented at the semiconductor substrate which cannot bear high temperatures, for example.

The edge termination trench may reach from the main surface of the semiconductor device into a depth of at least 20% (or at least 50% or at least 70%) of a thickness of the semiconductor substrate or into depth of at least 30% (or 50% or 70%) of a drift zone of the semiconductor device or into a back side emitter doping region at the back side of the semiconductor substrate, for example.

Details regarding a main surface and a semiconductor substrate are explained in connection with FIG. 1*b*.

An active area of the semiconductor substrate may be a central area on the die of the semiconductor device surrounded by an edge termination region. The active area of the semiconductor substrate may be an area of the semiconductor substrate for implementing the electrical functionality of the semiconductor device. The width of the edge region may depend on the blocking voltage, the functionality and/or the die size of the semiconductor device. For example, the active area may be a part of the semiconductor substrate comprising all electrical elements (e.g. doping regions as source region, body region or drift region) required for a desired functionality to be provided by the semiconductor device.

The anodic oxidation may be carried out as described in connection with FIG. 6, for example.

The edge termination trench may be filled at least partly or may be filled completely with an insulating material or a passivation material as for example a polymer (e.g. Benzocyclobutene BCB).

The method 900 may comprise one or more further optional acts corresponding to one or more aspects mentioned in connection with described concepts or one or more embodiments described above. Further, features of the method 900 may be used also by one or more embodiments described above, for example.

Figure 10:
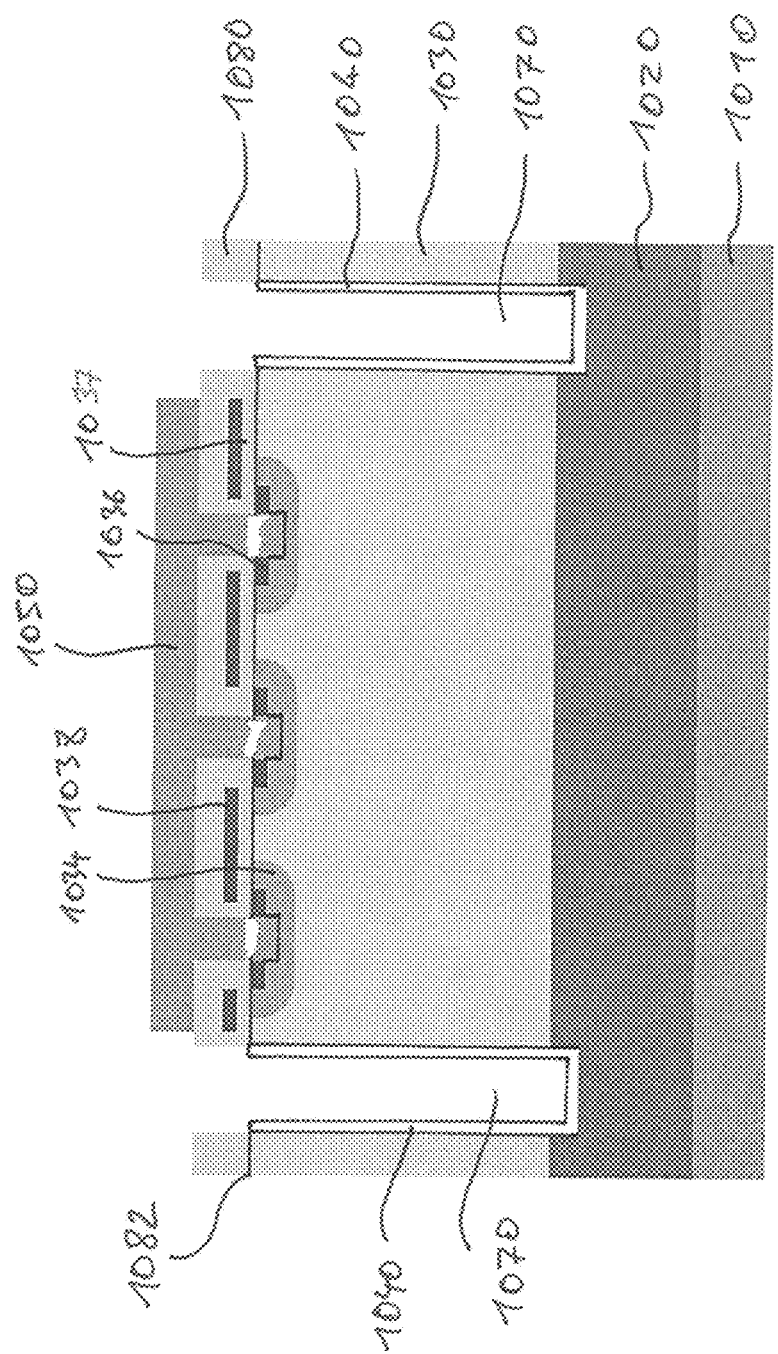
FIG. 10 shows a schematic cross section of a semiconductor device.

FIG. 10 shows a schematic cross section of a semiconductor device according to an embodiment. The semiconductor device shown in FIG. 10 may be formed by a method described above. The semiconductor device comprises a plurality of planar MOSFET-structures within the active area of the semiconductor device. Each MOSFET-structure comprises at least a gate 1038, a source region 1036 and a body region 1034. The source regions 1036 and the body regions 1034 are electrically connected to each other by a front side source metal layer 1050. Further, a gate oxide 1037 insulates the gates 1038 from the source regions 1036 and the body regions 1034, Additionally, the semiconductor substrate comprises a common n-doped drift zone 1030 of the plurality of MOSFET-structures. Further, the semiconductor substrate comprises a highly n-doped substrate (e.g. emitter) 1020 arranged at the back side surface of the semiconductor substrate and a back side metal layer 1010 electrically connecting the highly n-doped substrate arranged at the back side surface of the semiconductor substrate. Further, a trench 1070 is etched at an edge region of the semiconductor device 1070 surrounding a cell field or active area of the semiconductor device. The trench comprises walls covered with an anodic oxide layer 1040 formed by an anodic oxidation. Further, the trenches may be filled with a polymer afterwards.

In other words, a trench edge of a semiconductor device may be implemented by forming a MOSFET with a cell structure at the wafer front side (e.g. planar cells are shown but trench gate cells may be also possible). The cell field may be at source potential (e.g. 0 Volt during operation of the semiconductor device) and also the gate potential may deviate only by some Volts (e.g. few tens of volts) from the source potential, while the drain potential may arise to several hundred volts depending on the blocking capability, for example. The drain potential may reach the front side at the chip edge 1082 (e.g. due to crystal damages during sawing). Therefore, the drain voltage may be cut down at the front side laterally, for example. For this, trench edges may be implemented, the deep trenches reaching through at least 50% of the drift zone, often also into the n+ substrate, which are etched surrounding outside the active regions (e.g. cell field), since these trenches may require only few space in comparison to planar edges, for example. The trench etching may be done at the process end, when the front side metal is already formed and no high temperatures may be possible anymore, for example.

The trenches may be filled by an insulator (e.g. BCB). The stability of the edges may be improved by a passivation of the surface of the trenches with a high quality oxide.

Therefore, the trenches are anodically oxidized and lined or filled by an insulator (e.g. a polymer as PCB or polyimide). The filling of the trenches is not shown in FIG. 10.

Due to the anodically grown oxide, a low surface charge or oxide charge amount of less than $1E12 e/cm^2$ or better less than $5E11 e/cm^2$ may be provided (e=elementary charge). Therefore, the blocking capability of the trenches may be improved, since no high surface charges may occur, for example.

Some embodiments relate to a semiconductor device formed according to the described concept or one or more embodiments described above.

Some embodiments relate to a low temperature backside oxide. The manufacturing of oxides with high quality at simultaneously low temperatures may be possible also below 400° C. by using the described concept, for example. In comparison, oxides formed by plasma-induced chemical gaseous phase deposition (e.g. Plasma-Enhanced Chemical Vapor Deposition CVT, PECVT) may reach the range of 200° C., but without a following annealing act at higher temperature no good oxide quality may be obtained.

After the complete processing of a wafer at the frontside, the wafer may be attached to a carrier system for vertical devices and may be thinned at the backside. If further process acts may be desired at this time at the backside, the available temperatures are limited due to the frontside metallization and/or by the valuable carrier systems (e.g. glass carrier and glue). For the processing of the wafer backside, individual processes such as oxide deposition and/or metal deposition as well as structuring may be desired.

According to the proposed concept or one or more embodiments described above, voltage depending thick oxides at the wafer backside (backside oxides) may be formed, which may be used in various technologies. For example, at 400 Volts/600 Volts/1200 Volts IGBTs, the method may be used to implement oxide in the region of the etch termination between silicon and backside metal in order to reduce the charge carrier flooding (carrier confinement) in the etch region. For example, the backside of an IGBT wafer, which comprises a structured p-emitter, may be oxidized so that a sufficiently thick oxide layer is obtained on the very low p-doped or also n-doped regions in the edge region, which may be positive for the reverse blocking capability and/or the dynamic switch-off robustness of the IGBT chips, for example.

Further, a source down technology may also use an oxide in the region of, for example, 0.5-1 μm thickness at the wafer backside in order to enable an insulation between drain and gate. This oxide thickness may be scaled with the requirements for the blocking voltage, for example.

The anodic oxide may be masked by a structured photoresist or in connection with a nitride layer in order to form a low temperature local oxidation of silicon LOCOS (e.g. LOCOS like backside oxide), for example. Additionally the anodic oxidation may be coupled with a simultaneous electrochemical etching of neighboring (p-doped) regions.

With such an oxide mask, a stepped implementation mask may be generated for implementing a stepped field stop for improving the diode and/or IGBT softness, for example. Further this may be used for devices with highly doped emitter regions neighboring lowly doped emitter regions (at the backside). In this case, also n-regions neighboring p-emitter regions may be implementable, since the n-regions may be covered by an insulating oxide during the anodic oxidation and may not influence the blocking capability in this way, for example.

Another application may be a fast diode, which may comprise lightly n-doped regions neighboring highly n-doped regions at the wafer backside. In this way, a critical punch-through of the depletion zone to the backside metallization may be avoided and/or a disturbing contamination of the lightly doped backside regions by boron atoms may be avoided, for example.

The described concept may be used to generate cold oxides on arbitrary layers. For this, an n-doped polysilicon may be deposited on a surface and may be converted to silicon dioxide by the anodic oxidation afterwards. In comparison to a PECVD (Plasma-Enhanced Chemical Vapor Deposition) oxide deposition, the oxide quality may be higher and/or topology steps may be better filled. Further, an application may be a high temperature carrier system based on cold wafer bonding at the frontside, for example. The topology steps may be used as capillary tube for the following oxide etching for the wafer separation.

Optionally, the thickness of the cold oxide or anodic oxide may be increased in various ways. For example, a thickening of the cold formed oxide (oxide formed by anodic oxidation) may be done by generating trenches, which are dimensioned so that the trench as well as the measure (semiconductor material between trenches) is oxidized (trench may be closed due to the oxidation). A targeted tilt of the oxides may be formed by different widths of the trenches, for example. The depth of the trenches may define or influence the thickness of the resulting cold oxides.

Alternatively or additionally, an amorphous silicon or polycrystalline silicon may be deposited by HFCVD (Hot Filament Chemical Vapor Deposition at 150° C.-750° C.) and oxidized (by anodic oxidation) afterwards. This method may be repeated arbitrarily to generate a desired end thickness, for example.

The anodic oxidation may be used for growing silicon dioxide at nearly room temperature, for example. In this way, thermo mechanical stress may be reduced or avoided so that no significant wafer bow at room temperature may occur. Therefore, the manufacturing of sensor applications and/or MEMS applications (Micro Electromechanical System) with largely extending silicon cantilever or beam or large silicon membrane may be improved.

Further, gate oxides may be implemented at the backside. For example, an integration of MOS devices at the wafer backside may be possible. An application may be a bi-directionally blocking and/or a bi-directionally conducting MOS transistor.

Furthermore, a trench filling at load time bridges may be enabled. For example, trenches at etches may be filled by a low temperature filling of BCB (Benzocyclobutene) or another polymer at the end of the process, for example. In this way, a charge and trapärmere interface semiconductor/insulator may be formed with an anodic oxidation.

Trenches may be etched at the backside for source down transistors, which may be covered by anodic oxidation, for example. The bottom of the trench may be opened and filled with highly doped polys (silicon) or metal in order to obtain a conducting region. Alternatively, a silicon mesa region may be used for conducting, for example.

Examples may provide a structure and process flow for forming a silicon dioxide SiO2 layer with a low concentration of not reacted starting material and therefore with good electric quality (e.g. at the process end, with temperatures and following temperatures below 650° C., 450° C. or 250° C.).

The interface oxide/semiconductor can be adjusted and defined very well with the anodic oxidation. An oxide with high blocking capability may be implemented also at semiconductor surfaces with peaks or rough surface. Peaks at the semiconductor may get rounded, since the oxide may grow faster at the peaks of the semiconductor due to the concentration of the electric field lines, since the diffusion of the reaction partners (OH−) may be accelerated by the electric field. In this way, an electric field may be reduced during operation (of the semiconductor device) and may increase the operation safety of a device manufactured in this way. An oxide stack of an anodic grown oxide and a further oxide layer deposited at low temperatures may comprise a higher breakdown persistency than an oxide layer of deposited oxide of the same sum thickness.

Some embodiments relate to a power semiconductor with a self-adjustedly deposited insulation layer. Several applications may use self-adjusted or self-aligned oxidation of an n-doped silicon, for example. For example, p- and n-doped regions may be located adjacent to each other and mainly or only an oxidation of the n-doped regions may be done. Further, a thickness of the oxide may be increased.

In comparison to the selective deposition of oxide layers on n-doped regions based on an all over oxide deposition and following photo technique and etching acts is complex and is object to inaccuracies in comparison to the self-aligned method.

The self-aligned method may also be used for power applications, for example. The method may be based on an anodic oxidation as described in FIG. 4, for example.

If the electric field is varied at the surface of the semiconductor to be oxidized (e.g. by definition of the corresponding lateral doping profile at the semiconductor surface), the OH-diffusion and consequently also the reachable oxide thickness may be variable.

The anodic oxidation may be used to deposit a self-adjusted or self-aligned oxide layer on an n-doped region at specific device structures, for example.

A thicker oxide in the region of an n-doped drift zone than in the region of p-doped areas may be desired for IGBTs with a trench gate. The neighboring p-regions may be the p-body and/or the floating p-region. The thicker oxide may reduce current oscillations during the switch-off process of the IGBT, for example. The method may also be applied to super junction devices with a trench gate, for example.

For example, a thick oxide may be formed in the region of the n-doped drift zone and afterwards an additional oxide may be thermally grown within the whole trench region and the wafer surface, which may also be used as a gate oxide next to the p-body region, for example. Further, an additional thermal oxide act may be used for improving the quality of the anodic generated thick oxide, for example.

Additionally, weak spots of the oxide occurring at the transition from the trench bottom to the trench wall may be avoided by the thick oxide in this region, for example.

Further, a deposited oxide layer self-adjusted on n-doped area may be used within HDR-regions (High Dynamic Robustness) of IGBTs. These are regions, in which the backside p-emitter is left out in the etch region and optionally also in the region of gate pads and gate wiring or lines in order to avoid current superelevation, which may occur during the switch-off process within these regions. The increased local hole current density being in connection with this may lead to a local dynamic avalanche in these regions and consequently to a worsening of the safe operation area (SOA) of these devices. The self-adjusted covering of these n-doped regions with oxide layers may enable a certain reverse blocking capability of these devices, since the blocking pn-junction between the backside emitter and the drift zone or the field stop zone would be short cut without this insulation layer. Further, the risk of a dynamic punch-through of the depletion zone to the backside metallization (e.g. at cosmic radiation events) may be reduced or avoided. Furthermore, the described method may be used for thin wafer devices (e.g. 1700 Volt IGBTs, 1200 Volt IGBTs, 600 Volt IGBTs or 400 Volt IGBTs), since thermal deposition of backside oxides is not usable, especially at wafer diameters larger than or equal to 6", for example. After the anodic oxidation, an overetch may be done, which may etch the thin oxide at the p-region completely, while a part of the thick oxide on the n-region remains, since a thin oxide may grow also on the p-region during the anodic oxidation, for example.

The described method may enable a self-adjusted growth of oxides similar to a LOCOS-method. With the proposed method, a self-adjusted oxide step may also be obtainable in a vertical direction by a variation of the doping (e.g. by a step within the semiconductor region).

Further, oxides with very flat gradients may be formed by a variation of the height or magnitude of the p-doping and a corresponding lateral variation of the electric field strength at the semiconductor surface, for example. Such a flat gradient of an oxide may be significantly flatter than obtainable by another method with oxide grown all over, damaging the surface by damage implantation and isotropic etching, for example. Further, the root point or base point of the oxidation may be variable defined in its position in contrast to an etch edge.

According to an aspect, a self-aligned or self-adjusted insulation layer on n-doped regions may be implemented, which are arranged between p-doped regions. Such structures may be used for IGBTs with trench gate and/or IGBTs, which comprise HDR-structures, for example. Further, such self-aligned deposited layers may be formed in trenches of power MOSFETs (Metal Oxide Semiconductor Field Effect Transistor).

Some methods relate to the manufacturing of such anodically oxidized regions. Such methods may enable the manufacturing of (local) very thick anodic oxides, for example.

A further method for increasing the oxide thickness of an anodic oxidation may be providing an initially highly blocking configuration of pn-junctions to which high voltages may be applied for the anodic oxidation process, for example. After an anodic oxidation of a desired thickness is done, the existing pn-junction configuration may be adapted to a low voltage device class by preceding implantation, for example.

For the implementation of large field oxide FOX oxide thicknesses at medium voltage to high voltage MOSFETs, the pn-junction (local or global) may be implemented as highly blocking in order to enable an anodic oxidation to obtain large oxide thicknesses. Afterwards, the mesa region between the oxide may be adapted for a corresponding low voltage class by an epitaxial (Epi) enhancement implantation, for example.

Alternatively, a higher oxidation rate for thicker oxides may be obtained by an n-implant at the trench bottom or by a damage implantation, for example. An n-implantation may be compensated after the oxidation by a p-implant.

A vertically perforated oxide may be formed (e.g. to be used as diffusion barrier for diffusion material or elements or electron hole plasma) based on n- and players stacked above each other as starting material by trench etching and anodic oxidation and back-etching of the oxide at the p-regions and epitaxial filling of the trenches, for example. The layered pn-stack may be dispersed or cleared by an inter-diffusion, for example.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The non-transitory program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a semiconductor device, the method comprising:
   forming an electrical structure at a main surface of a semiconductor substrate;
   carrying out an anodic oxidation of a back side surface region of a back side surface of the semiconductor substrate to form an oxide layer at the back side surface of the semiconductor substrate after forming the electrical structure at the main surface; and
   forming an electrically conductive layer at the back side of the semiconductor substrate, wherein a first part of the electrically conductive layer is directly separated from the back side surface of the semiconductor substrate by the oxide layer formed by the anodic oxidation and a second part of the electrically conductive layer is formed directly on the back side surface of the semiconductor substrate.

2. A method for forming a semiconductor device, the method comprising:
forming an electrical structure at a main surface of a semiconductor substrate;
carrying out an anodic oxidation of a back side surface region of a back side surface of the semiconductor substrate to form an oxide layer at the back side surface of the semiconductor substrate; and
forming an electrically conductive layer at the back side of the semiconductor substrate, wherein at least a part of the electrically conductive layer is directly separated from the back side surface of the semiconductor substrate by the oxide layer formed by the anodic oxidation;
wherein the oxide layer remains at least at an edge termination region surrounding the semiconductor substrate, wherein the edge termination region is a region extending from an edge of the semiconductor substrate laterally towards an emitter region of an insulated gate bipolar transistor or a drain region of a metal oxide semiconductor transistor located at the back side within the semiconductor substrate.

3. A method for forming a semiconductor device, the method comprising:
forming an electrical structure at a main surface of a semiconductor substrate;
carrying out an anodic oxidation of a back side surface region of a back side surface of the semiconductor substrate to form an oxide layer at the back side surface of the semiconductor substrate; and
forming a p-doped region adjacent to an n-doped region at the back side surface of the semiconductor substrate before the anodic oxidation, wherein the oxide layer in a first portion of the back side surface extending along the n-doped region has a greater thickness than the oxide layer in a second portion of the back side surface extending along the p-doped region,
wherein the electrical structure at the main surface is more complex than the p-doped region and the n-doped region formed at the back side surface.

4. The method according to claim 3, further comprising removing the oxide layer within the second portion.

5. The method according to claim 3, comprising implanting dopants at the first portion and the second portion to form a stepped field stop region at least at the second portion.

6. A method for forming a semiconductor device, the method comprising:
forming an electrical structure at a main surface of a semiconductor substrate;
carrying out an anodic oxidation of a back side surface region of a back side surface of the semiconductor substrate to form an oxide layer at the back side surface of the semiconductor substrate after forming the electrical structure at the main surface; and
forming a field effect transistor structure at the back side of the semiconductor substrate, wherein the oxide layer forms a gate oxide of the field effect transistor structure at the back side.

* * * * *